United States Patent [19]
Tsujii

[11] Patent Number: 6,006,350
[45] Date of Patent: Dec. 21, 1999

[54] SEMICONDUCTOR DEVICE TESTING APPARATUS AND METHOD FOR TESTING MEMORY AND LOGIC SECTIONS OF A SEMICONDUCTOR DEVICE

[75] Inventor: Toshiyuki Tsujii, Tokyo, Japan

[73] Assignee: Mitsubishi Denki Kabushiki Kaisha, Tokyo, Japan

[21] Appl. No.: 08/946,991

[22] Filed: Oct. 8, 1997

[30] Foreign Application Priority Data

May 22, 1997 [JP] Japan ..................................... 9-132625

[51] Int. Cl.$^6$ ..................................................... G01R 31/28
[52] U.S. Cl. ........................................... 714/738; 714/718
[58] Field of Search .................... 714/724, 738, 714/739, 743, 744, 718, 33

[56] References Cited

U.S. PATENT DOCUMENTS

| | | |
|---|---|---|
| 4,348,759 | 9/1982 | Schnurmann ........................... 324/73.1 |
| 4,586,181 | 4/1986 | Shimizu ................................... 371/27.1 |
| 4,905,183 | 2/1990 | Kawaguchi et al. .................... 371/27.1 |
| 5,337,045 | 8/1994 | Shirasaka ............................. 340/825.52 |
| 5,654,971 | 8/1997 | Heitele ...................................... 714/735 |
| 5,835,506 | 11/1998 | Kuglin ...................................... 714/738 |

FOREIGN PATENT DOCUMENTS 60-95369 5/1985 Japan .
4-258774 9/1992 Japan .

Primary Examiner—Trinh L. Tu
Attorney, Agent, or Firm—Burns, Doane, Swecker & Mathis, LLP

[57] ABSTRACT

A semiconductor device testing apparatus for a memory-built-in logic LSI or the like, which has a hardware configuration that test patterns for logic and memory sections of the semiconductor device can be described independently of each other.

17 Claims, 8 Drawing Sheets

FIG.2
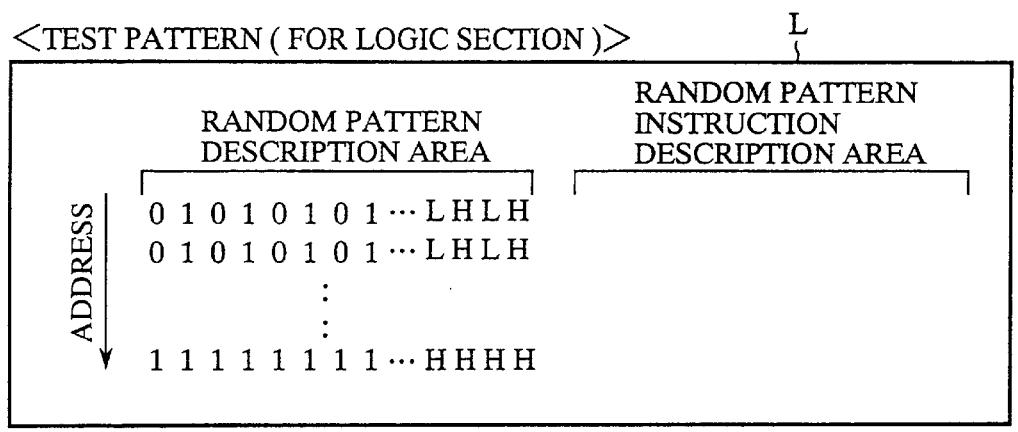
DESCRIBED INDEPENDENTLY OF BUT EXECUTED IN SYNCHRONIZATION WITH EACH OTHER
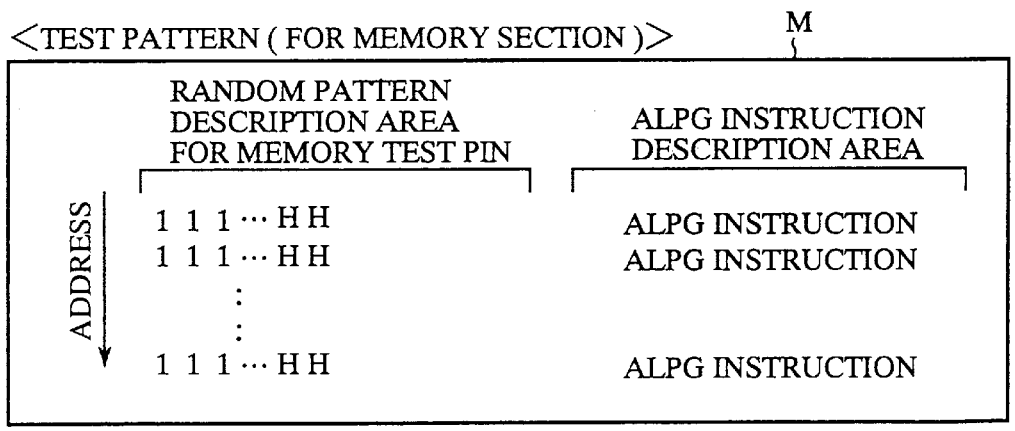

FIG.5

< TEST PROGRAM >

- START PAT00010-100, if adr = 11 then START MEMPAT 010-20

- EXECUTE LOGIC TEST PATTERN ( PAT0001) FROM ADDRESS 0 THROUGH 100
  - EXECUTE MEMORY TEST PATTERN ( MEMPAT01) FROM ADDRESS 0 THROUGH 20 WHEN EXECUTION ADDRESS OF LOGIC TEST PATTERN REACHES 11

- START MEMPAT 010-20, if adr = 1 or adr = 6 then START PAT 00010-100

- EXECUTE MEMORY TEST PATTERN ( MEMPAT 01 ) FROM ADDRESS 0 THROUGH 20
  - EXECUTE LOGIC TEST PATTERN ( PAT 0001) FROM ADDRESS 0 THROUGH 100 WHEN EXECUTION ADDRESS OF MEMORY TEST PATTERN ( MEMPAT 01) REACHES 1 (STARTING MEMORY WRITE), AND EXECUTE LOGIC TEST PATTERN (PAT 0001) FROM ADDRESS 0 THROUGH 100 WHEN EXECUTION ADDRESS OF MEMORY TEST PATTERN REACHES 6 ( STARTING MEMORY READOUT)

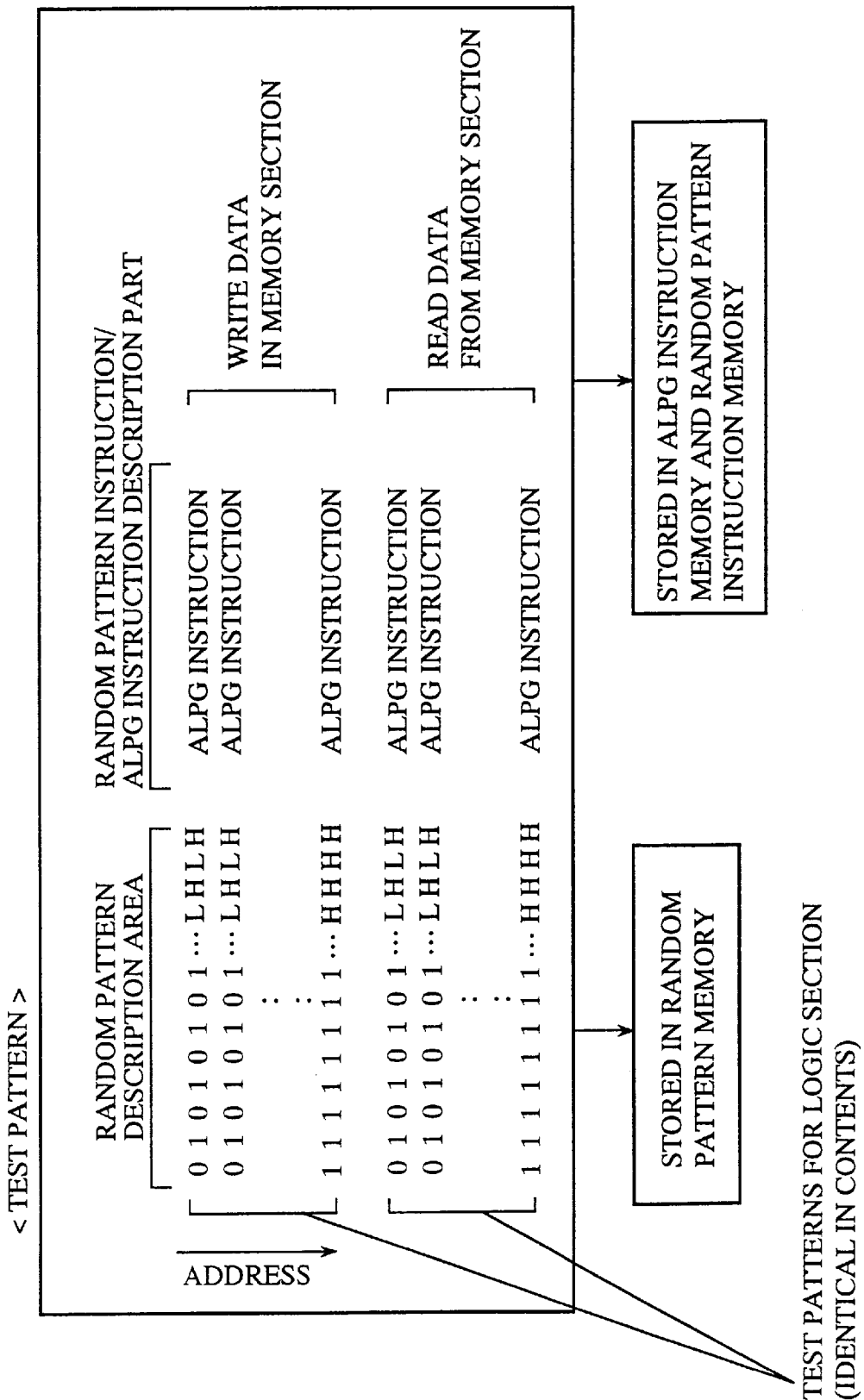

SEMICONDUCTOR DEVICE TESTING APPARATUS AND METHOD FOR TESTING MEMORY AND LOGIC SECTIONS OF A SEMICONDUCTOR DEVICE

BACKGROUND OF THE INVENTION

1. Field of the Invention

The present invention relates to a semiconductor device testing apparatus and a semiconductor device testing method for testing memory and logic sections of a semiconductor device such as a memory-built-in logic LSI with built-in memory and logic sections.

2. Description of the Prior Art

FIG. 6 is a block diagram schematically showing the configuration of a conventional semiconductor device testing apparatus for memory-built-in logic LSIS. In FIG. 6, reference numeral 1 denotes a random pattern memory for storing random patterns composed of input and output patterns of a logic section test signal, 3 an algorithmic pattern generator (hereinafter abbreviated as ALPG) for generating address/data patterns for testing a memory section of an LSI under test, 2 an ALPG instruction memory for storing instructions for the ALPG 3, 4 a pin selector for selecting a pin of the LSI for the application thereto of a test signal, 5 an OR gate, 6 a formatter for determining the timing of rise and fall of a test signal waveform, 9 a random pattern instruction memory for controlling the sequence of execution of random patterns, and 10 an instruction execution part for executing random pattern instructions stored in the instruction memory 9.

The operation of the illustrated semiconductor device testing apparatus will be described below.

For simultaneously testing both of memory and logic sections of a memory-built-in logic LSI under test (hereinafter referred to as a DUT) with a view to increasing test efficiency, the random pattern instruction execution part 10 extracts a random pattern instruction from the instruction memory 9 and follows the instruction to read out a random pattern from the random pattern memory 1. On the other hand, the ALPG3 fetches an ALPG instruction from the instruction memory 2 and follows the instruction to generate an address and data pattern. After the pin selector 4 selects a pin to which the address and data pattern is to be fed, the pattern is logically added by the OR gate 5 to the random pattern from the random pattern memory 1 to form a test signal, which is provided to the formatter 6, wherein the timing of its rise and fall is determined. The test signal is fed to a pin electronics composed of an amplifier, from which it is applied to the pin of the LSI selected by the pin selector 4.

FIG. 7 is a diagrammatic showing of an example of the test pattern that is fed to the semiconductor device testing apparatus of FIG. 6. The test pattern has a configuration that either one or both of instructions for controlling the operation of the ALPG 3 and random pattern instructions are described in a random pattern instruction/ALPG instruction description part. Conventionally, the instructions for the ALPG 3 need to have a one-to-one correspondence with the random test patterns. That is, it is necessary that a one-address ALPG instruction should be prepared for each one-address random test pattern. For this reason, in the case of simultaneously testing logic and memory sections of a memory-built-in logic LSI, since random patterns for logic requires several K to several M addresses, the ALPG instructions, which normally require several to tens of addresses, must be described so that the number of their addresses is equal to that of the random patterns. In concrete terms, the number of addresses of the ALPG instructions is increased, for example, by designating the addresses for the execution of the ALPG instructions by a small amount of addresses.

In the DUT there is a possibility that test results of the logic section, for instance, differ depending on whether the memory section is in its write operation or read operation—this is attributable to noise generation or the like by a difference between the memory operations. To avoid this, the logic section may sometimes be tested using a common random test pattern for every operation of the memory section. In such an instance, it is necessary in the conventional semiconductor device testing apparatus that random patterns for testing the logic section, which are composed of identical two parts for the write and read operations of the memory section, be described together with individual instructions for testing the memory section, as shown in FIG. 8. This inevitably involves the use of a large-scale random pattern memory for storing such an enormous amount of data.

The same goes for the memory section. That is, since test results on the memory section are likely to change with the kind of operation of the logic section, there is a case where the memory section is tested using common data for each operation of the logic section.

SUMMARY OF THE INVENTION

It is therefore an object of the present invention to provide a semiconductor device testing apparatus and a semiconductor device testing method which allow ease in the generation of test patterns for simultaneous testing of memory and logic sections of memory-built-in logic LSIs and facilitates testing of the influence of different or individual operations of the memory section on the operation of the logic section and vice versa with less test pattern storage capacity.

To attain the above object, according to a first aspect of the present invention, there is provided a semiconductor device testing apparatus in which test patterns for testing the logic section and for testing the memory section of the LSI are described independently of each other. This configuration allows ease in the generation of LSI test patterns and permits reduction of the test pattern storage capacity used.

According to a second aspect of the present invention, there is provided a semiconductor device testing apparatus in which has a storage for storing test patterns for the LSI memory section independently of a storage for storing test patterns for the logic section. This configuration produces the same effects as those obtainable with the configuration according to the first aspect.

According to a third aspect of the present invention, there is provided a semiconductor device testing apparatus which has an OR gate for logically adding together test patterns read out of test pattern memories for the logic and memory sections of the LSI under test, respectively. This configuration permits simultaneous testing of the logic and memory sections of the LSI.

According to a fourth aspect of the present invention, there is provided a semiconductor device testing apparatus which has a selector for applying test patterns to predetermined pins for testing the memory section of the LSI under test. This configuration permits reduction of the storage capacity for random test patterns to be applied to memory test pins.

According to a fifth aspect of the present invention, there is provided a semiconductor device testing apparatus which has a selector at a stage preceding a formatter for setting the timing of rise and fall of test patterns. This configuration ensures preventing the selector from exerting an influence on the quality of the input waveform to the LSI under test.

According to a sixth aspect of the present invention, there is provided a semiconductor device testing apparatus in which an instruction for starting the test pattern for the LSI memory section at a predetermined address is described in the test pattern for the LSI logic section. This configuration avoids the necessity of re-describing the LSI memory test pattern in the case of executing it in a different operating state of the logic section.

According to a seventh aspect of the present invention, there is provided a semiconductor device testing apparatus in which an instruction for starting the LSI memory test pattern at a predetermined address is described at plural positions in the LSI logic test pattern. This configuration produces the same effect as that obtainable with the configuration according to the sixth aspect of the invention.

According to an eighth aspect of the present invention, there is provided a semiconductor device testing apparatus in which an instruction for suspending the generation of the LSI memory test pattern is incorporated in the logic test pattern at the ending address thereof or at an address immediately preceding a start instruction of the next memory section test pattern. This configuration prevents runaway of the memory section testing operation.

According to a ninth aspect of the present invention, there is provided a semiconductor device testing apparatus in which an instruction for starting the LSI logic test pattern at a predetermined address is described in the memory test pattern. This configuration avoids the necessity of re-describing the logic test pattern in the case of executing it in a different operating state of the LSI memory section.

According to a tenth aspect of the present invention, there is provided a semiconductor device testing apparatus which is equipped with a function of always outputting a logical low level signal from a test pattern generation part not involved in the current test operation. This configuration prevents the test pattern being used in the current test operation from being affected by the test pattern not used.

According to an eleventh aspect of the present invention, there is provided a semiconductor device testing apparatus which further has a storage for storing test programs for both the logic and memory sections of the LSI under test, together with an instruction for the execution of the LSI memory test pattern when the logic test pattern satisfies a predetermined condition. This configuration allows ease in testing the memory and logic sections of the LSI in various combinations of their operating states.

According to a twelfth aspect of the present invention, there is provided a semiconductor device testing apparatus which further has a storage for storing test programs for both the logic and memory sections of the LSI under test, together with an instruction for the execution of the LSI logic test pattern when the memory test pattern satisfies a predetermined condition. This configuration produces the same effect as that obtainable with the configuration according to the eleventh aspect of the invention.

According to a thirteenth aspect of the present invention, there is provided a semiconductor device testing apparatus which further has a storage for storing control instructions of the testing apparatus, together with an instruction that designates the condition for execution of the test patterns for both the logic and memory sections of the LSI under test in preference to instructions contained in the both test patterns.

This configuration also produces the same effect as that obtainable with the configuration according to the eleventh aspect of the invention.

According to a fourteenth aspect of the present invention, there is provided a semiconductor device testing method which comprises the steps of testing the memory section of the device by using a first test pattern, and testing the logic section of the device by using a second test pattern described independently of the first test pattern. This method makes it easy to test a semiconductor device including a memory section and a logic section, and permits reduction of the test pattern storage capacity used.

BRIEF DESCRIPTION OF THE DRAWINGS

Other objects, features and advantages of the present invention will become more apparent from the following description taken in conjunction with the accompanying drawings in which:

FIG. 2 is a diagram showing, by way of an example, test patterns to be fed to a random pattern generation part and a memory pattern generation part, respectively, of the embodiment shown in FIG. 1;

FIG. 5 is a diagram showing part of a test program contained in a main program installed in a main storage (not shown) of a semiconductor device testing apparatus according to a fourth embodiment of the present invention;

FIG. 8 is a diagram showing another example of the test pattern to be fed to the testing apparatus of FIG. 6.

DETAILED DESCRIPTION OF THE PREFERRED EMBODIMENTS

A detailed description will be given of, with reference to the accompanying drawings, of the preferred embodiments of the present invention.

Embodiment 1

Figure 1:
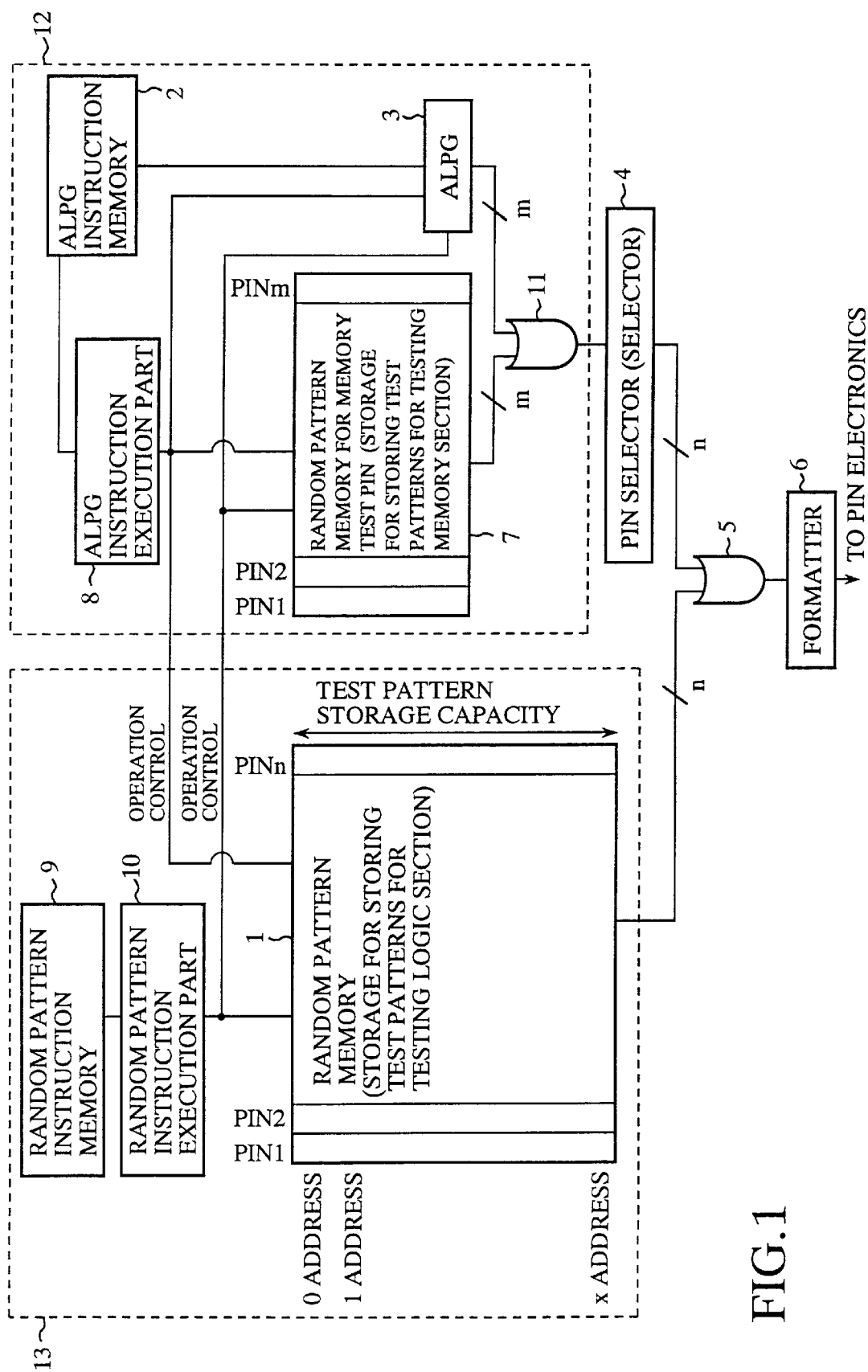
FIG. 1 is a block diagram schematically illustrating the configuration of a semiconductor device testing apparatus according to a first embodiment of the present invention.

In FIG. 1 there is schematically illustrated in block form the configuration of a semiconductor device testing apparatus according to a first embodiment of the present invention (Embodiment 1). Reference numeral 1 denotes a random pattern memory for storing random patterns composed of input and output patterns of a test signal for the logic section of a DUT (storage for storing test patterns for testing the logic section), 3 an ALPG for generating address and data patterns for testing the memory section of the DUT, 2 an ALPG instruction memory for storing ALPG instructions, 8 an ALPG instruction execution part for reading and executing ALPG instructions stored in the memory 2, 7 a random pattern memory for storing random patterns composed of test signal patterns to be applied to control pins of the DUT for testing its memory section (storage for storing test patterns for testing the memory section), 11 an OR gate, 4 a pin selector (selector) for selecting a pin of the LSI to which the test signal is to be applied, 5 an OR gate, 6 a formatter for determining the timing of rise and fall of the test signal waveform, 9 a random pattern instruction memory for storing instructions concerning the random patterns for controlling the logic section of the DUT, and 10 a random pattern instruction execution part for executing the random pattern instructions stored in the memory 9. The ALPG instruction memory 2, the ALPG instruction execution part 8, the random pattern memory 7, the ALPG 3 and OR gate 11 constitute a memory test pattern generation part 12. The random pattern instruction memory 9, the random pattern instruction execution part 10 and the random pattern memory 1 constitute a random pattern generation part 13.

Next, the operation of the testing apparatus of Embodiment 1 will be described.

In case of simultaneously testing the memory and logic sections of the DUT, the random pattern instruction execution part 10 in the random test pattern generation part 13 extracts a random pattern instruction from the instruction memory 9 and follows the instruction to read out a random pattern from the random pattern memory 1. On the other hand, in the memory test pattern generation part 12 the ALPG instruction execution part 8 reads out an ALPG instruction from the instruction memory 2 and follows the instruction to cause the ALPG 3 to output an address and data pattern to the OR gate 11, while at the same time causing the random pattern memory 7 to output a random pattern for memory test to the OR gate 11. The address and data pattern and the random pattern for memory test are logically added together by the OR gate 11 and the OR gate output is provided to the pin sector 4, which selects a pin to which the OR gate output is to be applied. The address and data pattern and the random pattern for memory test from the pin selector 4 are provided to the OR gate 5, wherein they are logically added to the random pattern for logic test from the random pattern memory 1. The added output, i.e. a test signal, is applied to the formatter 6, wherein the timing of rise and fall of its waveform is determined. The test signal is fed to a pin electronics composed of an amplifier circuit, from which it is applied to the pin of the DUT selected by the pin selector 4.

FIG. 2 is a diagram showing an example of the test patterns that are provided to each of the random pattern generation part 13 and the memory test pattern generation part 12. In the figure, reference character L denotes a logic test pattern (test pattern for testing the logic section) that is fed to the random pattern generation part 13, M a memory test pattern (test pattern for testing the memory section) that is fed to the memory test pattern generation part 12. As shown in FIG. 2, the test patterns L and M can be described independently of each other. Both the test patterns L and M are executed in synchronism with a reference clock signal that the testing apparatus has.

As described above, according to Embodiment 1, the memory test pattern M can be described regardless of the storage capacity for the logic test pattern L. The random pattern memory 7 for memory test pins needs only to have a size, in the pin direction, equal to the sum of the numbers of address bits and data bits that the ALPG 3 can generate and the number of control pins (usually within 10 pins) and the same depth as that of the ALPG instruction memory 2. Hence, a large-capacity memory like the random pattern memory 1 is not required.

Further, the pin selector 4 is placed at a stage preceding the formatter 5, and hence does not affect the quality of the input waveform to the DUT. Besides, the data in the random pattern memory 1 for the pins of the DUT, which use the memory test pattern M, are all set at zeros during test pattern compiling so that they are free from the influence of the logic test pattern L.

Embodiment 2

Figure 3:
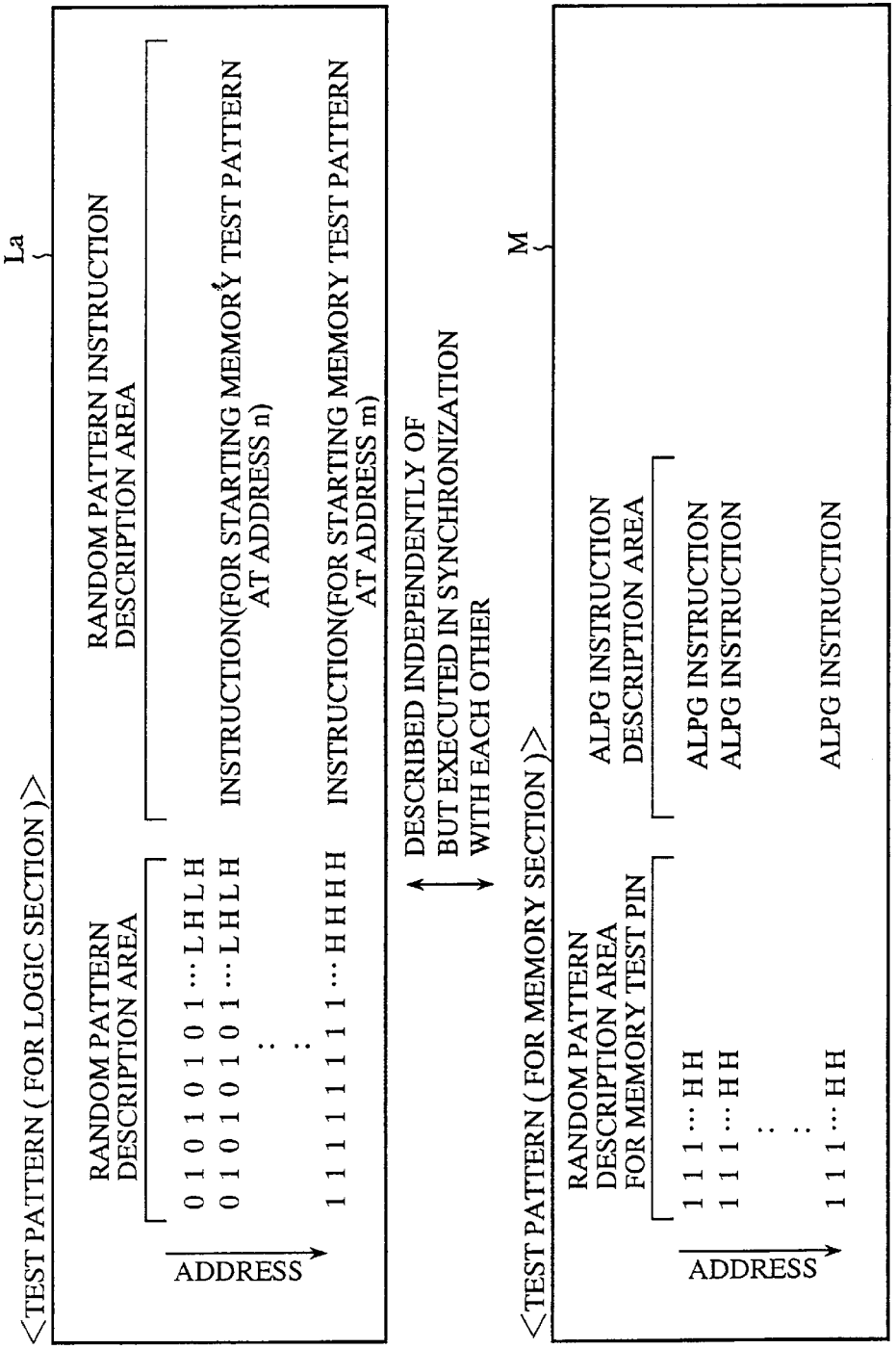
FIG. 3 is a diagram showing test patterns to be fed to a semiconductor device testing apparatus according to a second embodiment of the present invention.

FIG. 3 shows test patterns that are fed to the testing apparatus of a second embodiment of the present invention (Embodiment 2). In the figure, reference character La denotes a logic test pattern (test pattern for testing the logic section) and M a memory test pattern. The hardware configuration of Embodiment 2 is identical with that of Embodiment 1 depicted in FIG. 1.

The operation of Embodiment 2 will be described below.

As depicted in FIG. 3, according to Embodiment 2, instructions for controlling the operation of the memory test pattern generation part 12 and its operation starting address are incorporated as random pattern instructions in the logic test pattern La. This eliminates the need for re-describing the memory test pattern in the case of executing it at a different address of the random pattern. In this instance, the memory test pattern generation part 12 is set by a compiler to output logical "0" always while no test pattern therefrom is used. By this, it is possible to preclude the possibility of an unnecessary signal from the memory test pattern generation part 12 exerting a bad influence on the operation of the random pattern generation part 13. Moreover, when a start instruction for the memory test pattern generation part 12 is described as a random pattern instruction, the number of addresses to be executed therein may sometimes larger than that of random pattern execution addresses. As an insurance against this, provision is made to issue a warning when such a circumstance arises during test pattern compiling and to insert an instruction for suspending the operation of the memory test pattern generation part 12 at an address immediately preceding the start instruction for the next memory test pattern of the random pattern or at the ending address of the current random pattern.

As described above, according to Embodiment 2, there is no need of re-describing the memory test pattern in case of executing it at a different address of the random pattern.

Embodiment 3

Figure 4:
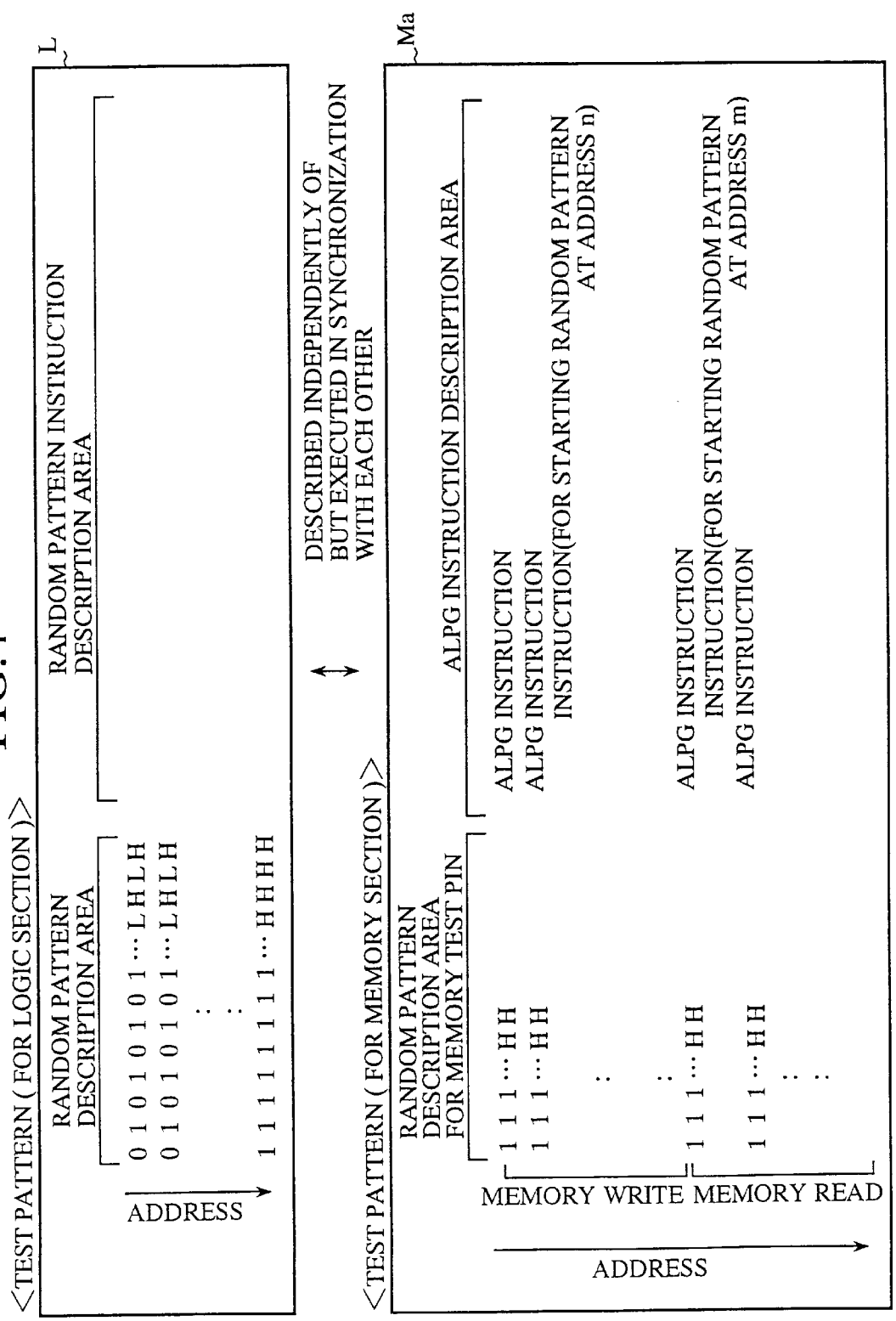
FIG. 4 is a diagram showing test patterns to be fed to a semiconductor device testing apparatus according to a third embodiment of the present invention.
Figure 6:
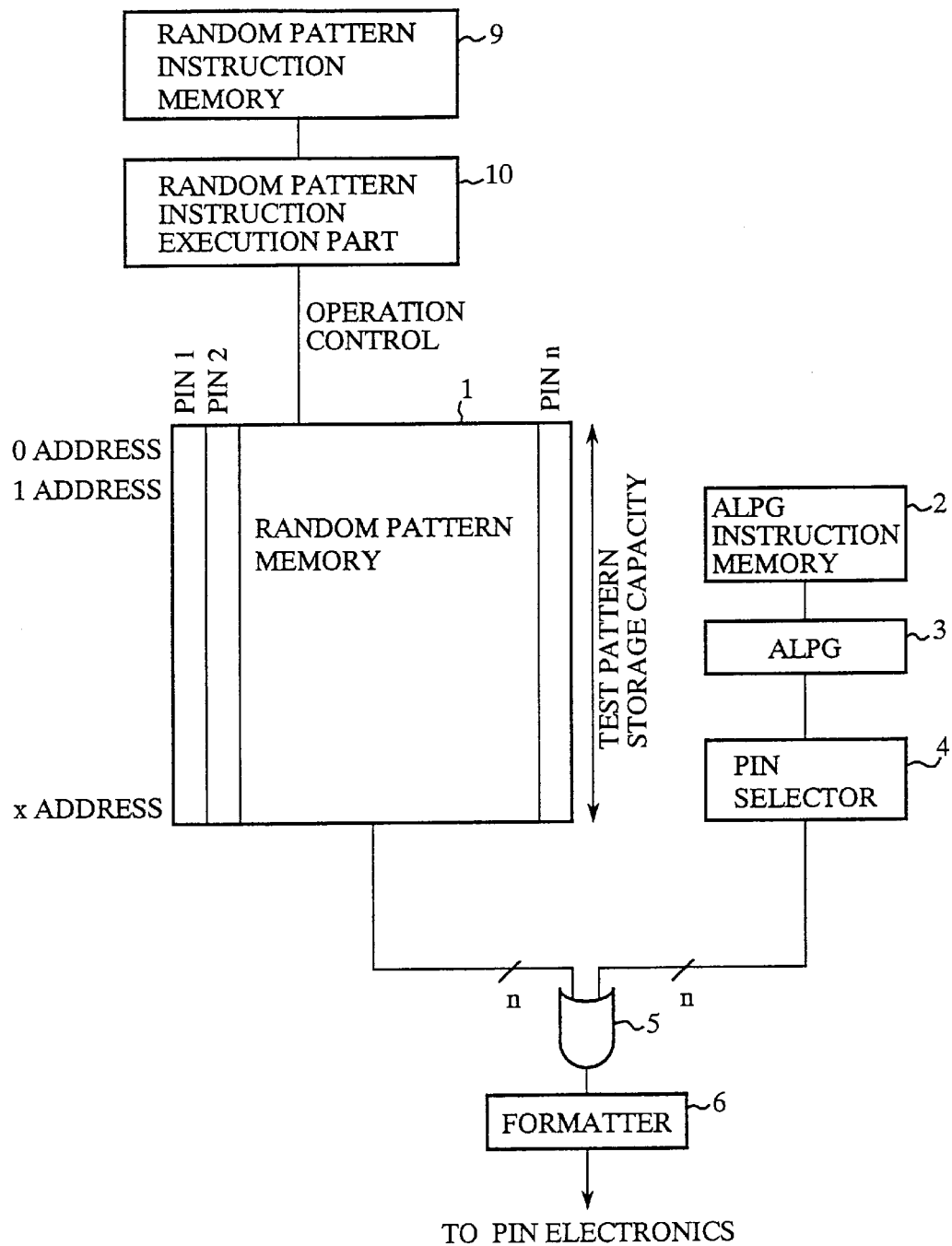
FIG. 6 is a schematic block diagram illustrating the configuration of a conventional memory-built-in logic LSI testing apparatus.
Figure 7:
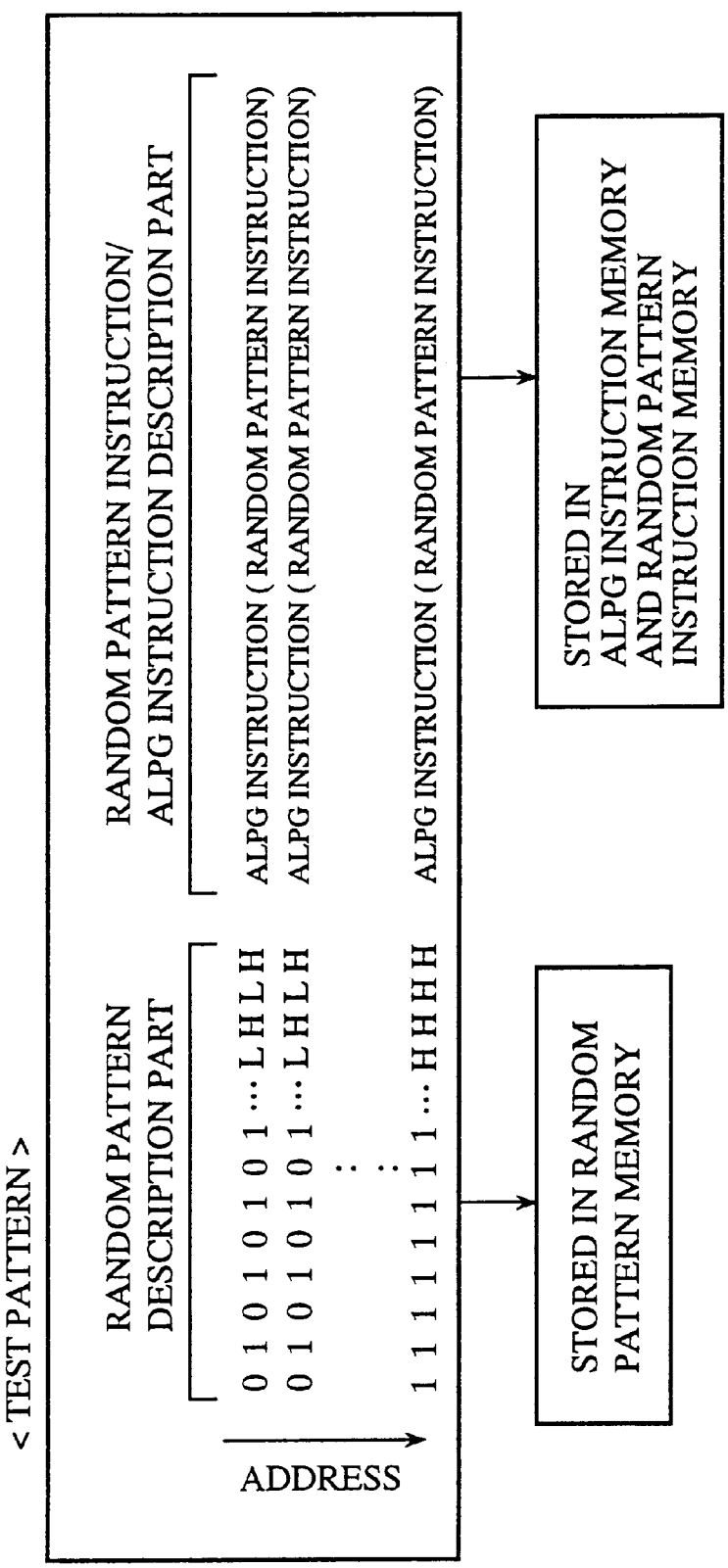
FIG. 7 is a diagram showing, by way of an example, test patterns to be fed to the testing apparatus of FIG. 6.

FIG. 4 shows test patterns that are fed to the testing apparatus of a third embodiment of the present invention (Embodiment 3). Reference character L denotes a logic test pattern and Ma a memory test pattern (test pattern for testing the memory section). The hardware configuration of Embodiment 3 is also identical with that of Embodiment 1 depicted in FIG. 1.

The operation of Embodiment 3 will be described below.

As illustrated in FIG. 4, according to Embodiment 3, instructions for controlling the operation of the random pattern generation part 13 and its operation starting address are incorporated in the ALPG instruction area of the memory test pattern Ma. This eliminates the need for re-describing the logic test pattern L in case of executing it in a different operating state of the memory section of the DUT. In this instance, the random pattern generation part 13 is set by a compiler to output logical "0" always while no random pattern therefrom is used. By this, it is possible to preclude the possibility that an unnecessary signal outputted from the random pattern generation part 13 exerts a bad influence on the operation of the memory test pattern generation part 12.

As described above, according to Embodiment 3, there is no need of re-describing the logic test pattern L in case of executing it in a different operating state of the memory section of the DUT.

Embodiment 4

FIG. 5 illustrates part of a test program included in a main program installed in a main memory (not shown) of the semiconductor device testing apparatus of a fourth embodiment of the present invention (Embodiment 4). The testing apparatus of Embodiment 4 is also identical in hardware configuration with Embodiment 1 shown in FIG. 1.

The operation of Embodiment 4 will be described below.

As shown in FIG. 5, according to Embodiment 4, there are incorporated, in the main program for controlling the operation of the testing apparatus, instructions for controlling a different operation of the test pattern generation part when the operating state of the logic test pattern or memory test pattern satisfies a certain condition. Incorporated in the main program in this instance are, for example, an instruction for executing the memory test pattern from address 0 through 100 upon execution of the logic test pattern to an address 11 and an instruction for executing the logic test pattern from address 0 through 100 upon execution of the memory test pattern to address 1 and then executing again the logic test pattern from address 0 through 20 upon execution of the memory test pattern to address 6. This facilitates testing of the memory and logic sections of the DUT in various combinations of their operating states.

Embodiment 5

According to a fifth embodiment of the present invention (Embodiment 5), there is incorporated in a utility command installed in a main memory (not shown) of the semiconductor device testing apparatus an instruction for controlling a different operation of the test pattern generation part when the operating state of the logic or memory test pattern satisfied a certain condition as in the Embodiment 4. This makes it possible to control the operation of the semiconductor device testing apparatus from outside during suspension of its program execution. Embodiment 5 is also identical in hardware configuration with Embodiment 1 shown in FIG. 1.

According to this Embodiment 5, the logic and memory sections of the DUT can easily be tested in various combinations of their operations.

While in the above the preferred embodiments of the present invention have been described, they should be construed as being merely illustrative of the invention not as limiting it and it will be apparent that many modifications and variations may be effected without departing from the novel concepts of the present invention.

What is claimed is:

1. A semiconductor device testing apparatus for testing a memory section and a logic section, each section being built in a semiconductor device, said apparatus comprising:

a first storage for storing a first test pattern for testing said memory section; and a second storage for storing a second test pattern for testing said logic section;

wherein an instruction for controlling said first test pattern is described in said second test pattern and an instruction for controlling said second test pattern is described in said first test pattern.

2. A semiconductor device testing apparatus for testing a memory section and a logic section, each section being built in a semiconductor device, said apparatus comprising:

a first storage for storing a first test pattern for testing said memory section; and a second storage for storing a second test pattern for testing said logic section, said second storage being independent of said first storage;

said second test pattern being described independently of said first test pattern.

3. The apparatus according to claim 2, further comprising:

an OR gate for logically combining said first test pattern read out of said first storage to said second test pattern read out of said second test storage, and outputting an combined test pattern.

4. The apparatus according to claim 2, further comprising:

a selector for applying said first test pattern to a predetermined pin of said semiconductor device.

5. The apparatus according to claim 4, wherein said selector is provided at a stage preceding a formatter for setting timing of rise and fall of said first and second test patterns.

6. The apparatus according to claim 2, further comprising:

a means for generating an instruction for starting said first test pattern at a predetermined address, said instruction being described in said second test pattern.

7. The apparatus according to claim 2, further comprising:

a means for generating a plurality of instructions for starting said first test pattern at predetermined addresses, said instructions being described at a plurality of positions in said second test pattern, respectively.

8. The apparatus according to claim 2, further comprising:

a means for generating an instruction for suspending generation of said first test pattern, said instruction being incorporated in said second test pattern at an ending address thereof or at an address immediately preceding a start instruction of a next first test pattern.

9. The apparatus according to claim 2, further comprising:

a means for generating an instruction for starting said second test pattern at a predetermined address, said instruction being described in said first test pattern.

10. The apparatus according to claim 2, further comprising:

a test pattern generation part not involved in a current test operation outputting a logical low level signal.

11. The apparatus according to claim 2, further comprising:

a storage for storing test programs for said logic section and said memory section, together with an instruction for execution of said first test pattern when said second test pattern satisfies a predetermined condition.

12. The apparatus according to claim 2, further comprising:

a storage for storing test programs for said logic section and said memory section, together with an instruction for execution of said second test pattern when said first test pattern satisfies a predetermined condition.

13. The apparatus according to claim 2, further comprising a storage for storing control instructions of said apparatus, together with an instruction that designates a condition for execution of said first and second test patterns in preference to instructions contained in both of said test patterns.

14. A semiconductor device testing method for testing a memory section and a logic section built in a semiconductor device, respectively, said method comprising the steps of:

testing said memory section by using a first test pattern; and simultaneously testing said logic section by using a second test pattern described independently of said first test pattern.

15. The apparatus according to claim 2, further comprising:
- a first OR gate for logically combining the first test pattern to an address; and
- a second OR gate for logically combining the second test pattern to an output of said first OR gate;
- wherein an output of said second OR gate is used for testing the memory section and the logic section of said semiconductor device.

16. A semiconductor device testing method for testing a memory section and a logic section built in a semiconductor device, respectively, said method comprising:
- a first step of storing a first test pattern, said first test pattern being for testing said memory section;
- a second step of storing a second test pattern, said second test pattern being for testing said logic section, and said second test pattern being described independently of said first test pattern;
- a third step of logically combining said first test pattern to an address; and
- a fourth step of logically combining said second test pattern to the logical addition of said first test pattern and said address to provide an output;
- wherein said output is used for testing the memory section and the logic section of said semiconductor device.

17. The semiconductor device testing method according to claim 16, wherein the third step is processed by a first OR gate, and the fourth step is processed by a second OR gate.

* * * * *